(12) United States Patent
Hwu

(10) Patent No.: US 7,531,104 B1
(45) Date of Patent: May 12, 2009

(54) MICRO-OPTIC ELEMENTS AND METHOD FOR MAKING THE SAME

(76) Inventor: Ruey-Jen Hwu, 3767 E. Brockbank Dr., Salt Lake City, UT (US) 84124

( * ) Notice: Subject to any disclaimer, the term of this patent is extended or adjusted under 35 U.S.C. 154(b) by 1313 days.

(21) Appl. No.: 10/104,900

(22) Filed: Mar. 20, 2002

(51) Int. Cl.
C23F 1/00 (2006.01)

(52) U.S. Cl. ............................... 216/80; 216/47; 216/67

(58) Field of Classification Search .................. 216/2, 216/26, 47, 49, 67, 72, 80
See application file for complete search history.

(56) References Cited

U.S. PATENT DOCUMENTS

| | | | |
|---|---|---|---|
| 4,836,637 A | 6/1989 | Poorman et al. | |
| 5,247,186 A | 9/1993 | Toda | |
| 5,286,338 A | 2/1994 | Feldblum et al. | |
| 5,298,366 A | 3/1994 | Iwasaki et al. | |
| 5,300,263 A | 4/1994 | Hoopman et al. | |
| 5,310,623 A | 5/1994 | Gal | |
| 5,316,640 A | 5/1994 | Wakabayashi et al. | |
| 5,370,768 A * | 12/1994 | Mersereau et al. | 216/26 |
| 5,504,302 A | 4/1996 | Hentze et al. | |
| 5,598,493 A | 1/1997 | Bonham, Jr. et al. | |
| 5,604,635 A | 2/1997 | Lawandy | |
| 5,629,997 A | 5/1997 | Hardy, Jr. | |
| 5,705,025 A * | 1/1998 | Dietrich et al. | 438/29 |
| 5,737,126 A * | 4/1998 | Lawandy | 359/620 |
| 5,751,871 A | 5/1998 | Krivoshlykov et al. | |
| 5,811,322 A | 9/1998 | Robinson | |
| 5,853,960 A * | 12/1998 | Tran et al. | 430/321 |
| 5,871,653 A | 2/1999 | Ling | |
| 5,982,552 A | 11/1999 | Nakama et al. | |
| 5,995,289 A | 11/1999 | Hwu et al. | |
| 6,002,703 A | 12/1999 | Hwu et al. | |

(Continued)

OTHER PUBLICATIONS

Guo, L., et al., "Novel Method for Fabricating Microlens Arrays," *Proceedings of SPIE* 3099:99-106, Munich, Jun. 1997.

(Continued)

*Primary Examiner*—Lan Vinh

(57) ABSTRACT

A method of making micro-optic elements. In one embodiment, photo-resist elements each having predetermined dimensions are transferred onto a substrate. The photo-resist elements are exposed to a reflow process to shape the top surface of the elements into a curved surface. The method also involves a reactive ion etching process having controlled parameters, such as a photo-resist depth and the selectivity between the substrate and photo-resist. A predetermined photo-resist depth and selectivity form a micro-optic element having a predetermined shape, preferably an elliptical or parabolic shape. In another aspect of the present invention, a micro-optic element is used to construct a micro-mirror for eliminating filamentation and promoting single mode operation of high-power broad area semiconductor lasers. The lenses and micro-mirrors produced by methods disclosed herein are configured to collimate the output of high-power lasers and promote a Gaussian intensity profile laser beam from a broad area laser beam.

21 Claims, 5 Drawing Sheets

U.S. PATENT DOCUMENTS

| | | | |
|---|---|---|---|
| 6,013,399 A * | 1/2000 | Nguyen | 430/5 |
| 6,078,070 A | 6/2000 | Robinson | |
| 6,147,737 A | 11/2000 | Yachi | |
| 6,219,187 B1 | 4/2001 | Hwu et al. | |
| 6,249,034 B1 | 6/2001 | Li | |
| 6,251,700 B1 | 6/2001 | Lin et al. | |
| 6,259,713 B1 | 7/2001 | Hwu et al. | |
| 6,411,754 B1 * | 6/2002 | Akkaraju et al. | 385/22 |
| 6,627,305 B1 * | 9/2003 | Deane et al. | 428/304.4 |

OTHER PUBLICATIONS

"Rockwell Scientific: Optical Components" [online], Rockwell Scientific Company LLC, <http://www.rockwellscientific.com/opticalcomponents> [retrieved May 8, 2002].

Schulze, J., et al., "Contactless Embossing of Microlenses—A New Technology for Manufacturing Refractive Microlenses," *Proceedings of SPIE* 3099:92-98, Munich, Jun. 1997.

* cited by examiner

MICRO-OPTIC ELEMENTS AND METHOD FOR MAKING THE SAME

FIELD OF THE INVENTION

The present invention is related to micro-optic elements (MOE) and, more particularly, to elliptical and parabolic micro-optic elements, such as micro-lenses, micro-lens arrays (MLA), micro-reflectors, and micro-mirrors made by reactive ion etching (RIE).

BACKGROUND OF THE INVENTION

In recent years, interest in the field of micro-optics has continued to increase. For instance, miniature lenses, micro-lenses, and micro-lens arrays are in demand for applications involving optical computing, optical information processing, and communications. In one specific example, micro-lenses and micro-lens arrays are used in various apparatuses for coupling light from a laser to an optical fiber and coupling light from an optical fiber to a photo-detector. In another example, a micro-reflector or a micro-mirror may be used to direct the light or construct external cavities. Several embodiments of an apparatus where a parabolic reflector is used to promote single transverse mode operation from high-power, multi-mode broad area diode lasers are shown in U.S. Pat. No. 6,002,703 to Hwu et al. Several embodiments of an apparatus where a parabolic mirror is used to collimate and direct the light from a high-power, multi-mode broad area diode laser are shown in U.S. Pat. Nos. 5,995,289; 6,219,187 B1; and 6,259,713 B1. Because of the increased demand for micro-lenses, micro-lens arrays, micro-reflectors, and micro-mirrors in such applications, considerable effort has been made in developing methods for making micro-optic elements.

One existing method for making micro-lenses and micro-lens arrays comprises the steps of forming an array of photo-resist elements on a substrate, melting the elements to a curved shape, and thereafter solidifying the elements. The photo-resist elements and the substrate are then subjected to an etching process involving a reactive gas. This process is referred to in the art as reactive ion etching (RIE). The photo-resist elements cause differential etching in the substrate such that the dome shapes of the original photo-resist elements are replicated in the substrate. Unfortunately, prior art methods produce many optical elements having deviations that cause unwanted light dispersions. In addition, known methods of producing micro-lenses and micro-lens arrays cannot effectively produce a lens with a specific profile, such as an elliptical or parabolic profile.

SUMMARY OF THE INVENTION

There exists a need for an improved method for manufacturing micro-optic elements with improved light dispersion characteristics. In addition, there exists a need for a method for manufacturing micro-optic elements with a specific profile, such as elliptical or parabolic profiles. The present invention relates to micro-optic elements including micro-lenses, micro-lens arrays, micro-reflectors, micro-mirrors, and a method for making the same. In one embodiment, a method of making a micro-optic element utilizes a photo-resist and a substrate. The photo-resist is patterned and transferred onto a substrate by any known method. The substrate may be constructed from any suitable material such as silicon, GaAs, fused silica, glasses, or the like. This part of the process also involves re-flowing, i.e., controlled melting, the photo-resist into a shape having a curved cross-section. In the re-flow process, surface tension of the semi-melted photo-resist causes the photo-resist to form a spherical shape.

The photo-resist and substrate are then processed in compliance with a suitable etching process, such as reactive ion beam etching process. More specifically, selected portions of the substrate are gradually removed by the etching process, wherein the spherical shaped photo-resist elements protect sections of the substrate. Eventually, the sections of the substrate that are covered by the shaped photo-resist elements take on the shape of a curved micro-optic element. In this case, the etching is differentially developed in two regions: in one region that is not covered by the photo-resist, the etching advances uniformly in a normal direction; and in the other region, which is covered by the photo-resist, the substrate is gradually etched in a curved formation. Since the photo-resist is formed into a shape having a curved cross-section, the tapered portion of the photo-resist is etched earlier than the portion of the photo-resist having a maximum thickness.

Next, the substrate and photo-resist are exposed to a stripping process to remove the remaining photo-resist from the substrate. When the photo-resist is completely stripped from the substrate, the resultant structure is in the form of a micro-lens or a micro-lens array disposed on the surface of the substrate. As a result of a predetermined photo-resist depth and selectivity of the etching process, a micro-optic element may be easily configured with an elliptical or parabolic profile. Optionally, the above-described fabrication method also includes the application of a thin coating material on at least one surface of each micro-lens.

In another embodiment of the present invention, a method of making a micro-reflector or micro-mirror having an elliptical or parabolic profile is provided. In one specific embodiment, the micro-optic elements formed in accordance with the present invention are used as master elements to mold micro-reflectors or micro-mirrors. In this specific embodiment, the micro-optic elements are made using the above-described reactive ion etching process. Next, the micro-reflectors or micro-mirrors are then formed on the micro-optic elements by the use of any molding process, such as injection molding, thermal embossing, UV embossing, or the like. The resultant micro-reflectors or micro-mirrors can be used to capture, collimate, and direct light from high-power, multi-mode, broad-area semiconductor lasers.

In accordance with another embodiment of the present invention, the etching ratio of the substrate to photo-resist, also referred to as the etch-rate selectivity, is maintained during the reactive ion etching process at a predetermined level to produce a lens having a desired elliptical or parabolic profile. In one specific embodiment, a reactive ion etching process that is controlled to maintain a selectivity of at least 5:1 is used to form a lens having a parabolic or elliptical profile. In this embodiment, the flow rates of gases applied in the reactive ion etching process are adjusted to obtain the predetermined selectivity.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

The present invention relates to micro-optic elements and a method for making the same. In one aspect of the present invention, the method for making micro-optic elements involves a reactive ion etching process having controlled process parameters, such as a predetermined photo-resist depth and etch-rate selectivity. As a result of a predetermined photo-resist depth and selectivity, one embodiment of the fabrication process forms a micro-optic element having a predetermined shape, such as an elliptical or a parabolic shape. In another embodiment of the present invention, a micro-lens having a curved cross-section is used to construct micro-mirrors—also referred to as external cavities. The resultant profile of the external cavity formed in this embodiment reduces the filamentation of a laser and promotes the single mode operation of a high-power, broad area semiconductor laser.

Figure 1:
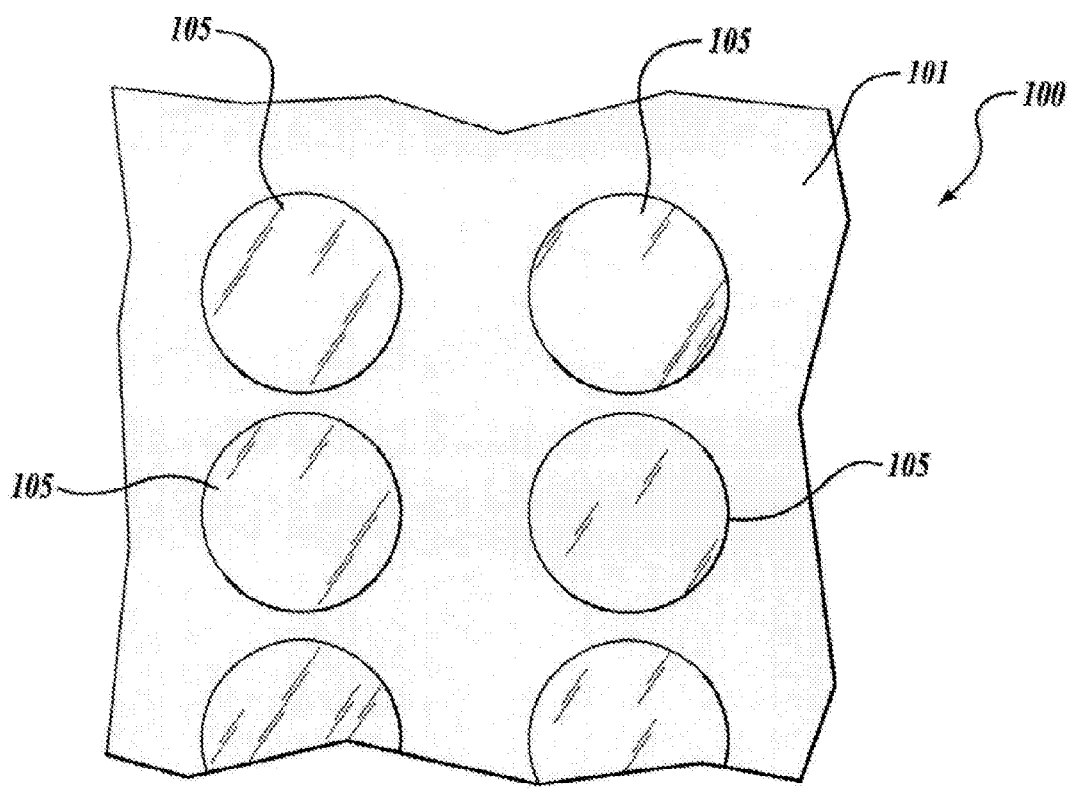
FIG. 1 is a top view of part of a substrate upon which photo-resist elements have been formed for the purpose of making a micro-optic element array.
Figure 2A:
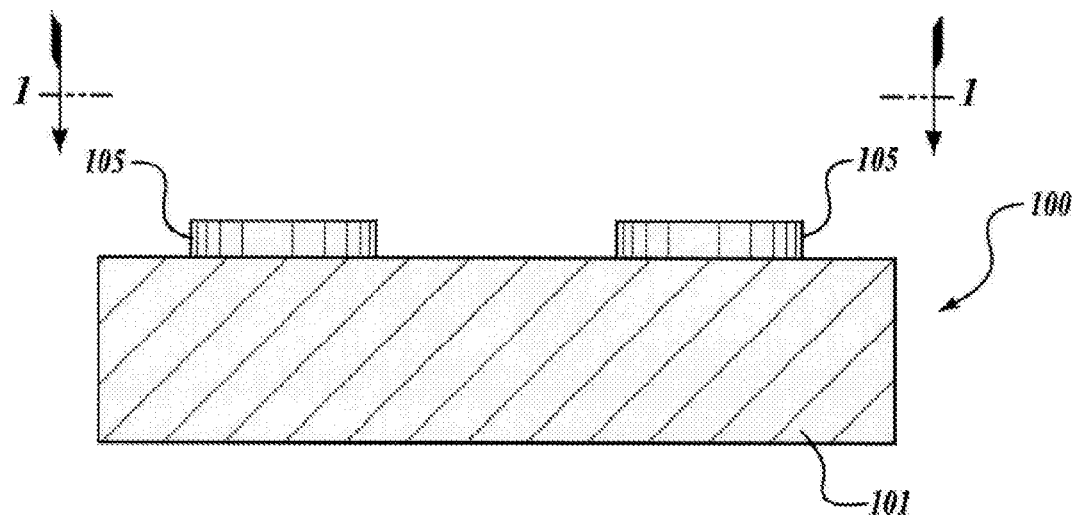
FIGS. 2A-2D illustrate a fabrication process for forming a micro-optic element and an external cavity device.

Referring now to FIGS. 1 and 2A, one embodiment of a fabrication process for forming a micro-optic element array, such as a micro-lens array, is shown and described below. As shown, the fabrication process involves a structure 100 having an array of photo-resist elements 105 on a substrate 101. As can be appreciated by one of ordinary skill in the art, the formation of an array of photo-resist elements 105 on a substrate 101 may be made by any generally known fabrication process involving a suitable photo-resist material. For instance, the photo-resist elements 105 may be conveniently formed by a masking process.

The photo-resist material used for the formation of the micro-lens array may be made of any material that suitably transfers a pattern to a substrate during an etching process. For instance, in one embodiment, a suitable photo-resist is AZ9260, from the Shipley Company of Marlborough, Mass. As will be described in more detail below, the use of a photo-resist such as AZ9260 promotes the formation of a micro-optic element having an elliptical or parabolic profile.

In accordance with one embodiment of the present invention, a micro-optic element, such as a lens, may have a diameter greater than fifty microns. In addition, each micro-optic element in an array of micro-optic elements may be regularly spaced at a distance greater than about ten microns. The substrate 101 can be at any thickness, as is appropriate for its subsequent use. Although the illustrated embodiment shows a structure 100 having an array of photo-resist elements 105 in a straight-line configuration, it is within the scope of the present invention to configure any number of photo-resist elements 105 in any pattern or on any number of sides of the substrate. For example, a hexagonal arrangement can be used to improve the fill factor of the fabrication process.

In one specific embodiment, the substrate 101 can be made of silicon. In this specific embodiment, the photo-resist elements 105 may have a diameter of about four hundred microns and a height of about one hundred microns. As can be appreciated by those skilled in the art, the substrate 101 may be made of any other material useful as a lens or reflector. For instance, the substrate 101 may be made of indium phosphide, zinc selenide, gallium arsenide, various glasses, sapphire, fused silicon, or the like. For embodiments to be utilized as a lens or reflector, the material of the substrate 101 should be one that is transparent to the light. In other embodiments, the substrate 101 may be any other material that suitably supports the fixation of a reflective coating.

As will be described in further detail below, one embodiment of the present invention involves the formation of master elements, which are ultimately used to construct an array of external cavity reflectors. In such an embodiment, the substrate 101 may be made from any material having sufficient strength for supporting the formation of an external cavity device made of various materials such as metals, plastics, glass, or combinations thereof.

Figure 2B:
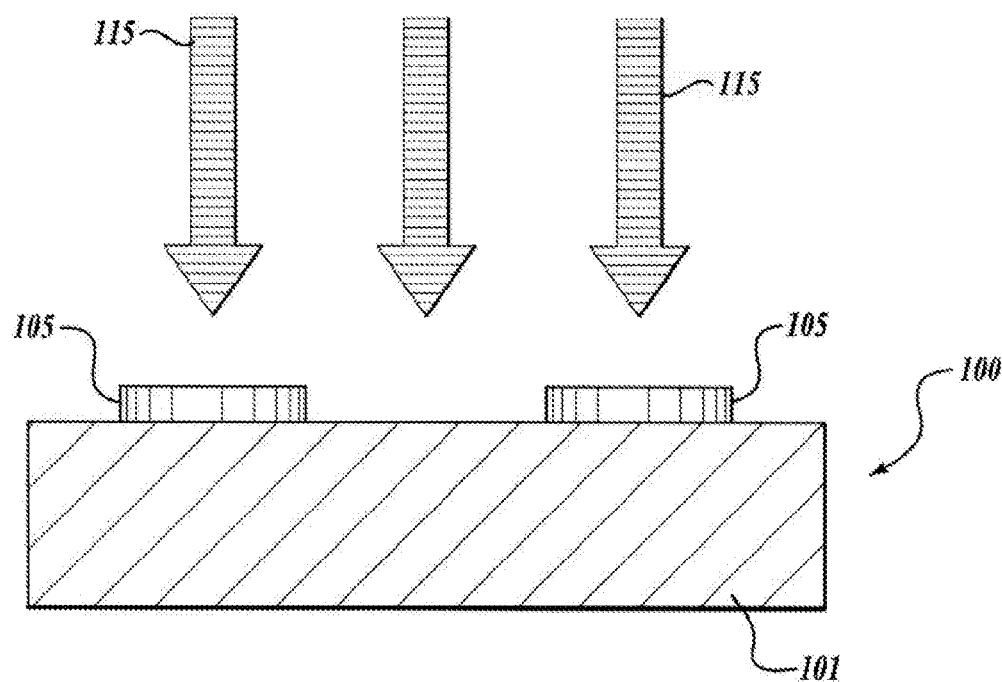

Referring now to FIG. 2B, the fabrication process continues where the photo-resist elements 105 are melted, thus causing the photo-resist elements 105 to assume elliptical, curved or hemispherical shapes. During the melting process, heat (referenced as item 115) is applied to the structure 100. In one embodiment, the area surrounding the structure 100 is raised to a temperature of about one hundred and forty degrees Celsius for a period of approximately four minutes to achieve one desired shape of the photo-resist elements 105. Although this specific example is used to illustrate one embodiment of the present invention, any process that forms a photo-resist material into a curved shape falls within the scope of the present invention.

Figure 2C:
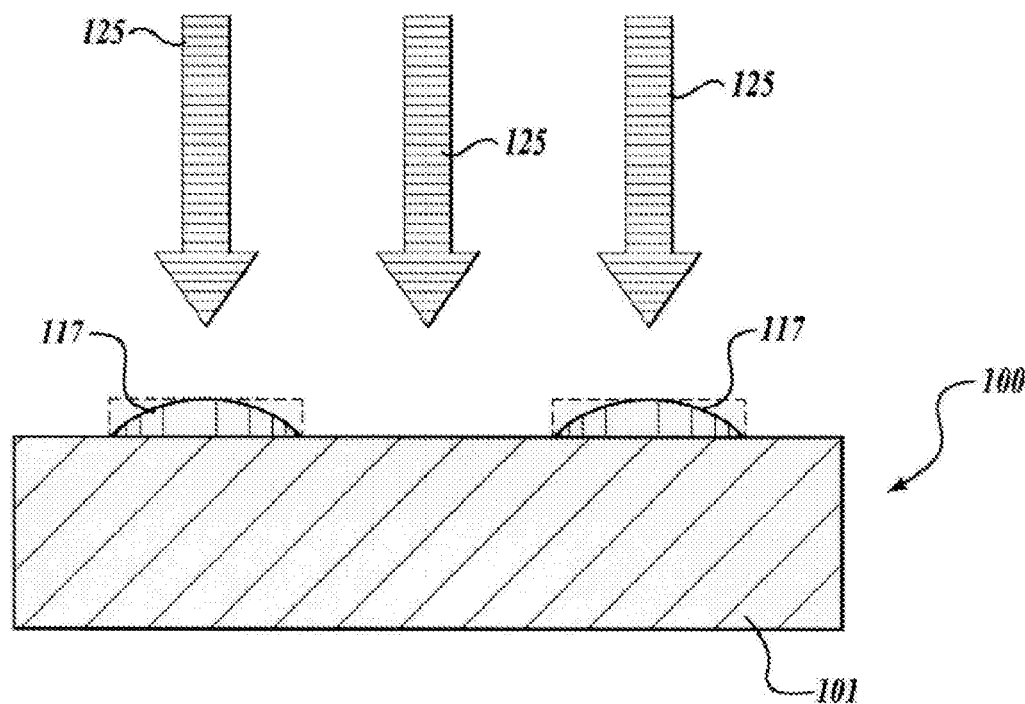

Referring now to FIG. 2C, the formed photo-resist elements 117 are melted to a curved or hemispherical shape from a substantially rectangular shape, which is illustrated by the dashed lines. Once the photo-resist elements are formed into a curved shape, the formed photo-resist elements 117 are then hardened to stabilize the desired shape of the photo-resist elements 117. In one embodiment, the formed photo-resist elements 117 may be hardened by cooling the photo-resist elements 117 to room temperature.

After the photo-resist elements are shaped into a curved form, an etching process is used to form a lens under each photo-resist element 117. In one embodiment of the present invention, a reactive ion etch reactor is used to etch each lens. Referring to the illustration of FIG. 2C, the structure 100 is placed in the reactive ion etch reactor such that the formed photo-resist elements 117 can be exposed to an etch gas 125. When exposed to the structure 100, the reactive ions of the etch gas 125 affect both the formed photo-resist elements 117 and the substrate material such that, after a period of time, the surface of the substrate 101 is formed into a configuration having a number of shaped lenses. One illustrative example of such a substrate 101 having a number of shaped lenses is shown in FIG. 2D.

Figure 2D:
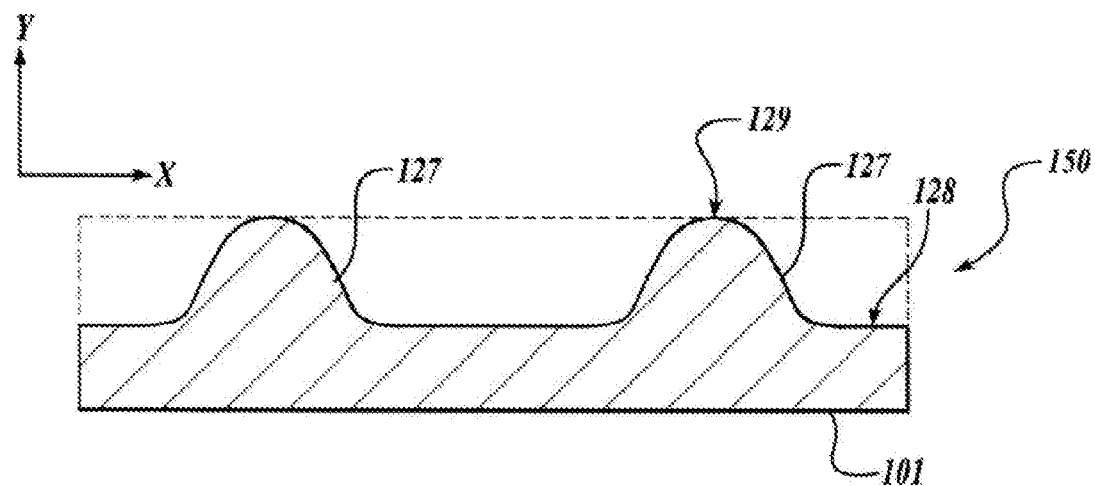

As shown in FIG. 2D, the substrate 101 comprises a plurality of shaped lenses 127 formed on the top surface of the substrate 101, where the dashed lines represent the region of the substrate 101 that was removed by the etch gas 125. As will be described in further detail below, the shape of each lens 127 formed on the substrate 101 is determined by controlling the selectivity during the reactive ion etching process. After the substrate 101 has been exposed to the reactive ion etching process, the residual photo-resist material is removed from the surface of the substrate 101 by the use of a suitable stripping material, such as acetone. The resultant structure 150 comprises a formed substrate 101 having a number of lenses 127 formed with an elliptical or parabolic profile. In this specific example, the diameter at the base of each lens is approximately four hundred microns; and the height, which is measured from the top of the lens 129 to the surface of the substrate 128, is approximately one hundred microns. Optionally, the focal length of each lens can be within the range greater than about one millimeter and less than about twenty millimeters.

To achieve the embodiment illustrated in FIG. 2D, various settings of the above-described reactive ion etching process are controlled to produce the elliptical or parabolic shaped elements. In one example, the selectivity between the substrate and the photo-resist is maintained at a value approximate to 5:1 during the reactive ion etching process. The selectivity of 5:1 is achieved by the utilization of a silicon substrate and a photo-resist material referred to as AZ9260. In addition, the flow rates of the etch gas 125 also control of the selectivity during the etching process. In one embodiment, the reactive ion etching process involves an etch gas 125 mixture of $SF_6$ and $O_2$, wherein the etch gas 125 comprises approximately 25% $SF_6$ and 5% $O_2$. During the reactive ion etching process, the gas pressure may be maintained at approximately 15 mT, and the ion beam extraction voltage may be maintained at approximately 40 volts. In addition, the substrate temperature may be maintained at room temperature. In yet another examples, the selectivity between the substrate and the photo-resist is greater than 5:1. In such alternative embodiments, the above-described etching process may include the method of maintaining the selectivity at a value of 8:1.

Figure 3A:
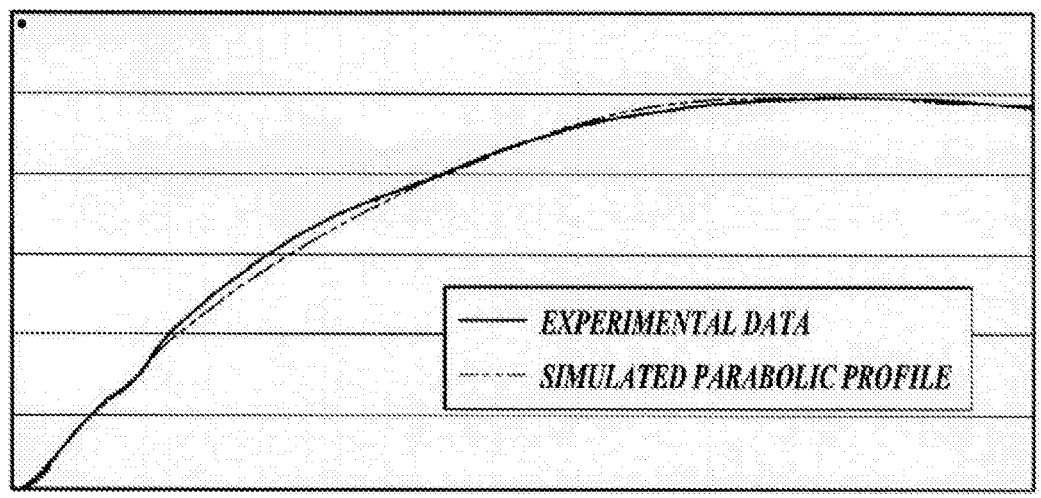
FIG. 3A is a graphical representation of a cross-section of a micro-optic element formed in accordance with the present invention.

Another embodiment of the fabrication process involves the configuration of the photo-resist depth to a predetermined value. In this embodiment, in addition to controlling the etch-rate selectivity during the etching process, the adjustment of the photo-resist depth also contributes to an accurate formation of a micro-optic element having a parabolic or elliptical profile. FIG. 3A illustrates one specific curve that models the cross-section of a micro-optic element produced by this embodiment of the fabrication process. In addition, sample curve equations illustrating the precise shape of a micro-optic element made by this method are described in more detail below.

For illustrative purposes, ellipse and parabola equations are used to model specific profiles of the above-described micro-optic elements. The equations described below also illustrate that, when etched at a predetermined rate, an elliptical shaped micro-optic element having specific dimensions is similar to a parabolic shaped micro-optic element. In one example, a reflector having a diameter of four hundred micrometers and height of one hundred micrometers is modeled. With this given diameter and height, a parabolic profile is described as:

$$Y_{para} = 100 - \frac{x^2}{400} \quad \text{(Equation 1)}$$

With respect to the illustration of FIG. 3A, the "X" denotes the horizontal component of the profile and the "Y" denotes the vertical component of the profile. In an example involving a predetermined photoresist height of one hundred micrometers and an etch-rate of five (a selectivity of 5:1), the radius R, and the profile $Y_{circle}$, are given below in Equations (2) and (3), respectively.

$$R = \frac{(h^2 + 200^2)}{2h} \quad \text{(Equation 2)}$$

$$Y_{circle} = \sqrt{R^2 - x^2} - R + h \quad \text{(Equation 3)}$$

By the use of Equations 2 and 3, an elliptical profile Y-ellipse can be described in Equation (4) with a height of 100 micrometers by multiplying the rate:

$$Y_{ellipse} = \text{rate} \cdot Y_{circle} = \text{rate} \cdot (\sqrt{R^2 - x^2} - R + h) \quad \text{(Equation 4)}$$

Figure 3B:
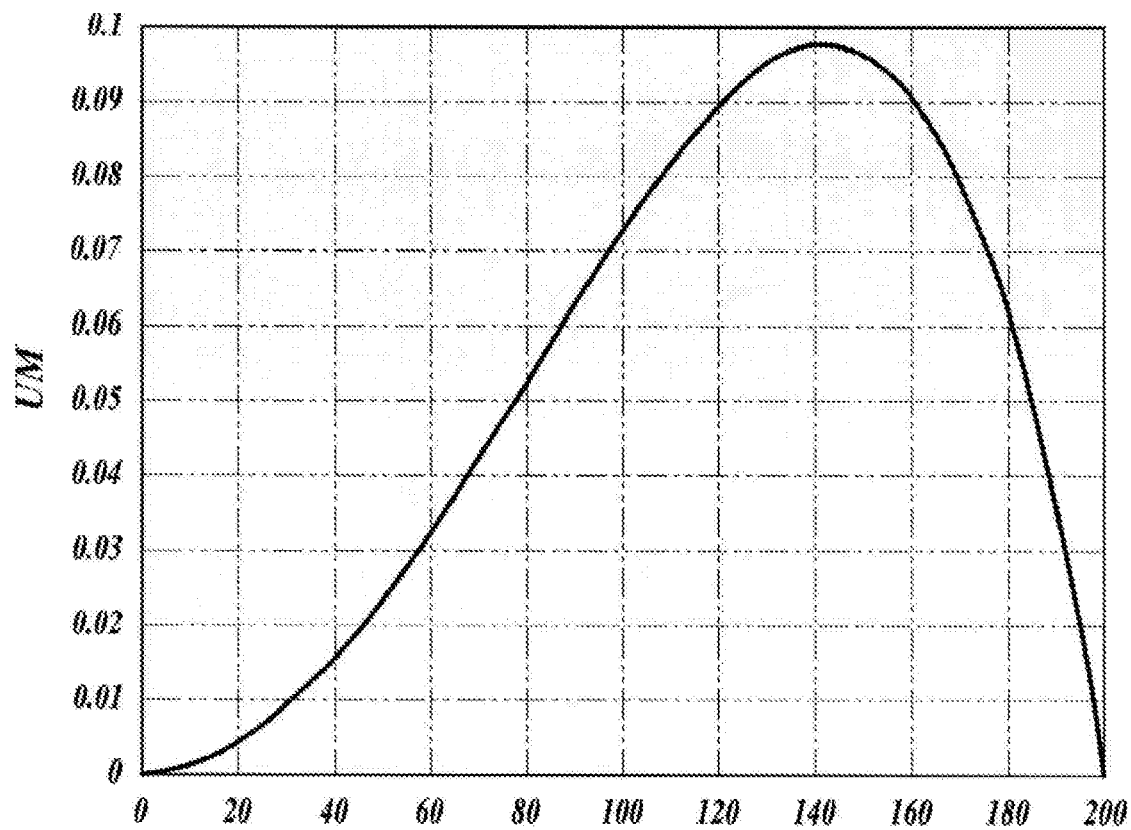
FIG. 3B is a graphical representation illustrating the difference between a lens having a parabolic profile versus a lens having a specific elliptical profile.

With predetermined etch-rate, diameter and height parameters, the resultant curves of a parabolic micro-optic element (Equation 1) and an elliptical micro-optic element (Equation 4) are substantially similar to one another. FIG. 3B is a graphical representation showing the difference between the two curves of Equations 1 and 4. As shown in the graphical representation of FIG. 3B the maximum deviation between the two curves is less than 0.1 micron. This example illustrates test results of a micro-optic element formed from an etching process where the selectivity was maintained at a value of 8:1. When a selectivity of 5:1 is applied to the above-described modeling equations, results have shown that the maximum deviation between an elliptical profile and a parabolic profile is 0.25 microns. In this analysis, the average deviation between the elliptical profile and the parabolic profile is approximately 0.05%. Accordingly, in view of the example above, an etch-rate selectivity of five (5:1) or greater results in a micro-optic element having a preferred profile.

In view of the operation of a Gaussian beam profile promoting cavity, such as those shown in U.S. Pat. No. 6,002,703 to Hwu et al., the error requirement to maintain the generation of a Gaussian beam profile from a parabolic or elliptical cavity is 5% or less. Thus, in view of the approximation of error between the elliptical and parabolic profiles, within certain tolerances, it appears that an elliptical micro-optic element can be used in applications that require a parabolic micro-optic element.

In another aspect of the present invention, another embodiment of a fabrication method is utilized for forming a reflector having a parabolic or elliptical profile. In one specific embodiment, the above-described fabrication process further comprises a molding procedure to form a reflector or array of reflectors. By the use of this embodiment, a plurality of shaped lenses or elements (127 of FIG. 2D) can be used as a master mold to repeatedly replicate a number of reflectors.

Figure 4:
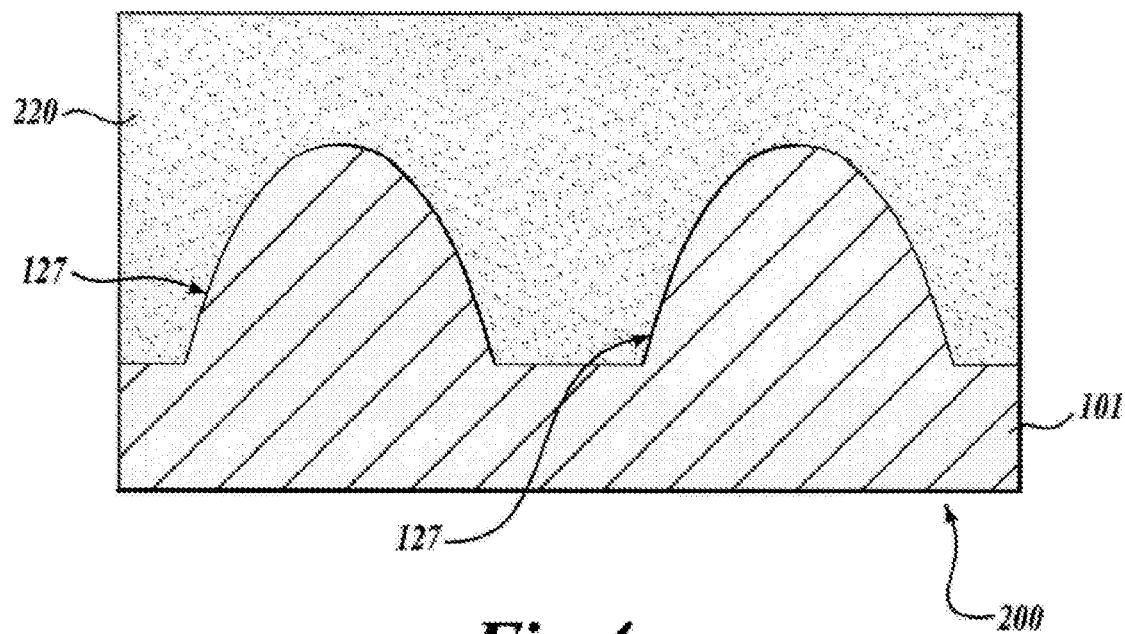
FIG. 4 is a cross-section of a structure used for forming an external cavity device formed in accordance with one embodiment of the present invention.

Referring now to FIG. 4, one embodiment of an assembly 200 used for forming a reflector array 220 is shown and described below. In the illustrated example, the assembly 200 may include a formed substrate 101 having a plurality of micro-optic elements 127, such as the formed substrate (101 of FIG. 2D) made by the above-described fabrication method. As described above, the plurality of micro-optic elements 127 are preferably formed to have an elliptical or parabolic profile.

In the fabrication of the reflector array 220, a softened molding material is disposed on the surface of the plurality of micro-optic elements 127. As shown in FIG. 4, when the molding material is applied, the plurality of lenses 127 shape the molding material into a formed reflector array 220 having a plurality of cavities. Accordingly, each cavity formed in the reflector array 220 adopts a profile similar to the profile of the micro-optic elements 127. As can be appreciated by one of ordinary skill in the art, this part of the process may involve any known material forming process, such as injection molding, thermal embossing, micro-molding, compression molding, or the like. The molding material can be made from any material that can be applied to the surface of the substrate 101 in a moldable state and then transformed into a hardened state. For instance, the molding material can be made form any plastic, metal, glass, polymer, gelatin, or any combination thereof. Once the cavities are formed in the reflector array 220, the molding material is then hardened to stabilize the shape of the formed cavities. The formed reflector array 220 is then removed from the substrate 101. Optionally, the formed reflector array 220 is then polished and coated with a reflecting material.

Figure 5:
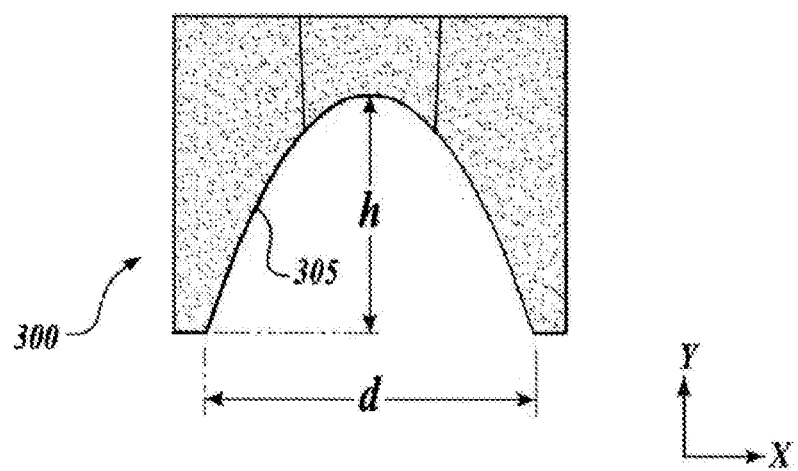
FIG. 5 is a cross-section of one embodiment of an external cavity device formed in accordance with one embodiment of the present invention.

Referring now to FIG. 5, one embodiment of a curved reflector 300 of a reflector array (item 220 of FIG. 4) is shown and described below. As shown in FIG. 5, the curved reflector 300 has a substantially elliptical or parabolic profile. In one embodiment, the curved reflector 300 may be formed from conventional materials that render the curved reflector 300 semi-reflective, so when light is directed into the cavity from a source, a portion of light is reflected back to the source, and the remaining portion of light is transmitted through the curved reflector 300. In such an embodiment, the curved reflector 300 can have a transitivity of up to about 30%, or a reflectivity of at least about 70%, or in another configuration, a transitivity of up to about 50%. The curved reflector 300 can be formed of light transmissive materials such as various plastics or glass. Optionally, a variety of conventional antireflective coatings or layers can be applied to the surface of the curved reflector 300 to produce the desired reflectivity or transitivity properties needed for a particular application. The reflective coatings or layers may be made from any reflective material such as $SiO_2$ and $TiO_2$ or $Ta_2O_5$. Such reflective materials can be applied to the curved reflector 300 surface at a temperature of 300° C.

In another embodiment, the curved reflector 300 is formed into a parabolic or elliptical cavity having a mirrored surface. In this embodiment, the curved reflector 300 can be formed of various materials such as metals, plastics, various glasses, or combinations thereof, and coated with a highly reflective material. For example, a layer of a suitable reflective metal can be disposed on the cavity surface of the curved reflector 300 to produce a mirrored surface. Suitable reflective metals include nickel, aluminum, or other reflective materials.

As described in U.S. Pat. Nos. 6,002,703; 6,219,187 B1; 5,995,289; and 6,259,713 B1 to Hwu et al., the subject matter of which is specifically incorporated by reference, the curved reflector 300 may be arranged to receive laser light from a semiconductor laser source. During operation, the semiconductor laser source emits a diverging beam that is incident upon cavity of the curved reflector 300. If the facet of the semiconductor laser source is located at the focal point of cavity, the filamentation of the beam that is transmitted through the curved reflector 300 is substantially reduced. In addition, the beam that is transmitted through the curved reflector 300 can be characterized as having a substantially Gaussian intensity profile. The remaining portion of beam fed into the curved reflector 300 is reflected back towards facet of the semiconductor laser source to produce an optical feedback effect. Accordingly, power enhancement and optimum beam profiling are achieved as a result of the elliptical or parabolic shape of the curved reflector 300.

While several embodiments of the invention have been illustrated and described, it will be appreciated that various changes can be made therein without departing from the purpose and scope of the invention. Similarly, any process steps described herein might be interchangeable with other steps in order to achieve the same result. In addition, the illustrative examples described above are not intended to be exhaustive or to limit the invention to the precise forms disclosed. For instance, another embodiment of a micro-lens array may comprise an array having a number of randomly spaced lenses or one individual lens. In one example, a number of individual micro-lenses and/or various combinations of other optical devices may be formed on one substrate. In such an example, each individual device can be configured with a number of similar or different cross-section profile shapes.

The embodiments of the invention in which an exclusive property or privilege is claimed are defined as follows:

1. A method of making a micro-optic element, wherein the method comprises:
    disposing at least one photo-resistant element on at least one surface of a substrate;
    forming a top surface of the photo-resistant element to a curved form;
    solidifying the formed photo-resistant element;
    exposing the substrate and the formed photo-resistant element to a reactive ion etch chamber; and
    etching the substrate and the formed photo-resistant element by controlling a selectivity ratio between the substrate and the formed photo-resistant element to greater than 5:1 and less than or equal to 8:1 so as to produce an elliptical or parabolic curved surface on the micro-optic element.

2. The method of claim 1, wherein etching the substrate and the formed photo-resistant element further comprises an ion beam extraction voltage of about 40 volts.

3. The method of claim 1, wherein the selectivity ratio is maintained at about 8:1.

4. The method of claim 1, wherein controlling the selectivity during the etching process comprises, controlling the flow rate of an etching gas to the substrate and the plurality of formed photo-resistant elements.

5. The method of claim 4, wherein the etching gas is a mixture of $SF_6$ and $O_2$.

6. The method of claim 5, wherein the etching gas is a mixture of $SF_6$ and $O_2$ is maintained at about 25% $SF_6$ and about 5% $O_2$.

7. The method of claim 5, wherein the etching gas further comprises a pressure of about 15 mT.

8. A method of forming a plurality of micro-optic elements, wherein the method comprises:
    disposing a plurality of photo-resistant elements on at least one surface of a substrate, wherein the plurality of photo-resistant elements are each formed to a predetermined height and predetermined diameter;
    forming the top surface of each photo-resistant element to a curved form;
    solidifying the plurality of formed photo-resistant elements;
    exposing the substrate and the plurality of formed photo-resistant elements to a reactive ion etch chamber; and
    etching the substrate and the plurality of formed photo-resistant elements by controlling a selectivity ratio between the substrate and the plurality of formed photo-resistant elements, and wherein the selectivity is controlled to be greater than 5:1 and less than or equal to 8:1, thereby forming a predetermined curved surface on the plurality of micro-optic elements, wherein the predetermined curved surface comprises an elliptical or parabolic curved surface on each of the plurality of micro-optic elements.

9. The method of claim 8, wherein the predetermined curved surface is formed such that, when a laser beam is directed through the predetermined curved surface, the predetermined curved surface produces an output laser beam having a Gaussian intensity profile.

10. The method of claim 8, wherein the predetermined curved surface is formed such that, when a laser beam is directed through the predetermined curved surface, the predetermined curved surface produces an output laser beam having a parabolic intensity profile.

11. The method of claim 8, wherein the plurality of micro-optic elements has a Gaussian intensity profile promoting surface.

12. The method of claim 8, wherein the plurality of micro-optic elements has a parabolic intensity profile promoting surface.

13. The method of claim 8, wherein the predetermined height of the photo-resistant elements is approximately twenty microns and predetermined diameter is approximately four hundred microns.

14. The method of claim 8, wherein control of the selectivity during the etching process comprises, controlling the flow rate of an etching gas to the substrate and the plurality of formed photo-resistant elements.

15. The method of claim 14, wherein the etching gas is a mixture of $SF_6$ and $O_2$.

16. The method of claim 8, wherein the method further comprises, forming a curved reflector structure on the surface of the plurality of micro-optic elements on the substrate, thereby forming a plurality of cavities on at least one surface of the curved reflector structure, wherein the individual cavities each comprise an elliptical or parabolic profile.

17. The method of claim 16, wherein the forming of the curved reflector structure comprises an injection molding process.

18. The method of claim 16, wherein the forming of the curved reflector structure comprises a thermal embossing process.

19. The method of claim 16, wherein the cavities comprise micro-mirrors having a parabolic profile.

20. The method of claim 16, wherein the cavities comprise micro-mirrors having an elliptical profile.

21. The method of claim 16, wherein the cavities comprise micro-mirrors having a Gaussian intensity promoting profile.

\* \* \* \* \*